(12) United States Patent
Kaka et al.

(10) Patent No.: US 7,633,699 B2
(45) Date of Patent: Dec. 15, 2009

(54) CPP READER WITH PHASE DETECTION OF MAGNETIC RESONANCE FOR READ-BACK

(75) Inventors: Shehzaad Kaka, Pittsburgh, PA (US); Mark William Covington, Pittsburgh, PA (US); Nils Jan Gokemeijer, Pittsburgh, PA (US); Michael Allen Seigler, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 524 days.

(21) Appl. No.: 11/639,589

(22) Filed: Dec. 15, 2006

(65) Prior Publication Data

US 2008/0144232 A1    Jun. 19, 2008

(51) Int. Cl.
G11B 5/02    (2006.01)
G11C 11/00    (2006.01)
G11C 11/14    (2006.01)
G11B 5/39    (2006.01)

(52) U.S. Cl. .................. 360/67; 360/324.1; 360/324.2; 257/421; 365/158; 365/171

(58) Field of Classification Search ............. 360/65–67, 360/313–328; 428/810–816; 257/421–427
See application file for complete search history.

(56) References Cited

U.S. PATENT DOCUMENTS

| | | | |
|---|---|---|---|
| 5,920,446 | A | 7/1999 | Gill |
| 6,501,971 | B1* | 12/2002 | Wolf et al. .................. 505/210 |
| 6,798,623 | B2 | 9/2004 | Seigler et al. |
| 7,042,685 | B2 | 5/2006 | Covington |
| 7,471,491 | B2* | 12/2008 | Sato et al. .................. 360/313 |
| 2003/0179514 | A1 | 9/2003 | Pinarbasi |
| 2003/0184918 | A1 | 10/2003 | Lin et al. |
| 2005/0023938 | A1 | 2/2005 | Sato et al. |
| 2006/0222835 | A1* | 10/2006 | Kudo et al. .................. 428/212 |

OTHER PUBLICATIONS

N. Stutzke et al., "Temperature and Field Dependence of High-Frequency Magnetic Noise in Spin Valve Devices", Applied Physics Letters, vol. 82, No. 1, Jan. 6, 2003, pp. 91-.
S. Yabukami et al., "Phase Detection of High-Frequency Carrier-Type Thin-Film Sensor", IEEE Trans. on Magnetics, vol. 39, No. 5, Sep. 2003, pp. 3196-3198.
S. I. Kiselev et al., "Microwave Oscillations of a Nanomagnet Driven by a Spin-Polarized Current", Nature, vol. 425, Sep. 25, 2003, pp. 380-383.
M. Covington et al., "Current-Induced Magnetization Dynamics in Current Perpendicular to the Plane Spin Valves", Physical Review B, vol. 69, 2004, pp. 184406-1 to 184406-8.
W. H. Rippard et al., "Current-Driven Microwave Dynamics in Magnetic Point Contacts as a Function of Applied Field Angle", Physical Review B, vol. 70, 2004, pp. 100406-1 to 100406-4.
S. I. Kiselev et al., "Current-Induced Nanomagnet Dynamics for Magnetic Fields Perpendicular to the Sample Plane", Physical Review Letters, vol. 93, No. 3, Jul. 16, 2004, pp.
B. Razavi, "A Study of Injection Locking and Pulling in Oscillators", IEEE Journal of Solid-State Circuits, vol. 39, No. 9, Sep. 2004, pp. 1415-1424.

(Continued)

*Primary Examiner*—A. J. Heinz
(74) *Attorney, Agent, or Firm*—Robert P. Lenart, Esq.; Pietragallo Gordon Alfano Bosick & Raspanti, LLP (57) ABSTRACT

An apparatus includes a magnetically biased multilayer structure having a reference layer and a free layer separated by a spacer layer; a DC current source connected to the multilayer structure; an AC current source connected to the multilayer structure; and a phase detector for measuring a phase difference between an AC current and a voltage across the multilayer structure. A method performed by the apparatus is also provided.

20 Claims, 8 Drawing Sheets

OTHER PUBLICATIONS

M. R. Pufall et al., "Frequency Modulation of Spin-Transfer Oscillators", Applied Physics Letters, vol. 86, 2005, pp. 082506-1 to 082506-3.

W. H. Rippard et al., "Injection Locking and Phase Control of Spin Transfer Nano-oscillators", Physical Review Letters, vol. 95, Aug. 5, 2005, pp. 067203-1 to 067203-4.

* cited by examiner

CPP READER WITH PHASE DETECTION OF MAGNETIC RESONANCE FOR READ-BACK

FIELD OF THE INVENTION

This invention relates to methods and apparatus for reading data from a magnetic storage medium, and more particularly to such methods and apparatus that include current-perpendicular-to-the-plane read elements.

BACKGROUND OF THE INVENTION

The read-back sensor in a hard disc drive recording head retrieves the data stored on a magnetic storage disc. Magnetoresistive (MR) thin film sensors have become the industry-standard technology for this critical role, with the technology evolving over the past decade from anisotropic magnetoresistance (AMR) to giant magnetoresistance (GMR) to, most recently, tunneling magnetoresistance (TMR). This evolution in reader technology will likely continue as the hard drive industry strives for further increases in areal density and data rate.

Readers will have to become physically smaller and operate at higher recording frequencies that are expected to be on the order of a few GHz. This scaling trend poses two significant problems for TMR sensors. First, the resistance of the sensor will inevitably increase as the sensor size (or, more specifically, the junction area) decreases, leading to more noise without the prospect of more amplitude. Secondly, ferromagnetic-based sensors, such as TMR sensors, have to contend with thermally activated magnetic noise that limits performance to frequencies below a resonant frequency that is typically on the order of a few GHz.

TMR-based readers are expected to work up to an areal density of approximately 500 Gbit/in$^2$. Alternative magnetoresistive technology, such as current-perpendicular-to-the-plane (CPP) GMR sensors, current-confined-path (CCP) GMR sensors, and extraordinary Hall effect (EHE) sensors, may achieve the combined amplitude and noise requirements at higher areal density. However, like TMR sensors, these new technologies will still have to contend with the noise and bandwidth limitations imposed by thermally activated magnetization dynamics. Hence, ferromagnetic-based MR technology will likely have only limited extendibility to higher recording frequencies. While clever engineering may be able to prolong the use of MR technology to densities beyond 500 Gbit/in$^2$, readers that rely upon magnetoresistance and simple magnetization rotation to transduce media flux into a read-back voltage will ultimately become inadequate if current industry trends continue.

Thus, there is a need for a reader technology that overcomes the limitations of prior art devices.

SUMMARY OF THE INVENTION

In a first aspect, the invention provides an apparatus including a magnetically biased multilayer structure having a reference layer and a free layer separated by a spacer layer, a DC current source connected to the multilayer structure, an AC current source connected to the multilayer structure, and a phase detector for measuring a phase difference between an AC current and a voltage across the multilayer structure.

A magnetic field source such as a permanent magnet or an electromagnet can provide a bias magnetic field for the multilayer structure. The bias magnetic field can be applied to the multilayer structure substantially in the plane of the free layer, or substantially perpendicular to the plane of the free layer. The reference layer can include a pinned layer and an antiferromagnetic layer. The multilayer structure can further include a second reference layer and a second spacer layer. The free layer can include a Hall effect layer.

In another aspect, the invention provides a method including: applying an AC current and a DC current to a magnetically biased multilayer structure having a reference layer and a free layer separated by a spacer layer, and detecting a phase difference between the AC current and an AC voltage across the multilayer structure.

DETAILED DESCRIPTION OF THE INVENTION

Spin valves include a reference layer having a fixed direction of magnetization, a free layer having a changeable direction of magnetization, and a spacer layer positioned between the reference layer and the free layer. If a spin valve is subjected to a bias magnetic field of sufficient magnitude and direction, and a DC current is passed through the spin valve, the current exerts a spin momentum transfer torque on the localized electron spins and can cause the direction of magnetization of the free layer to precess. The spin momentum transfer induced magnetic oscillation frequency is affected by a magnetic field applied to the spin valve. The magnetic oscillations are apparent as an oscillating voltage across the device.

Figure 1:
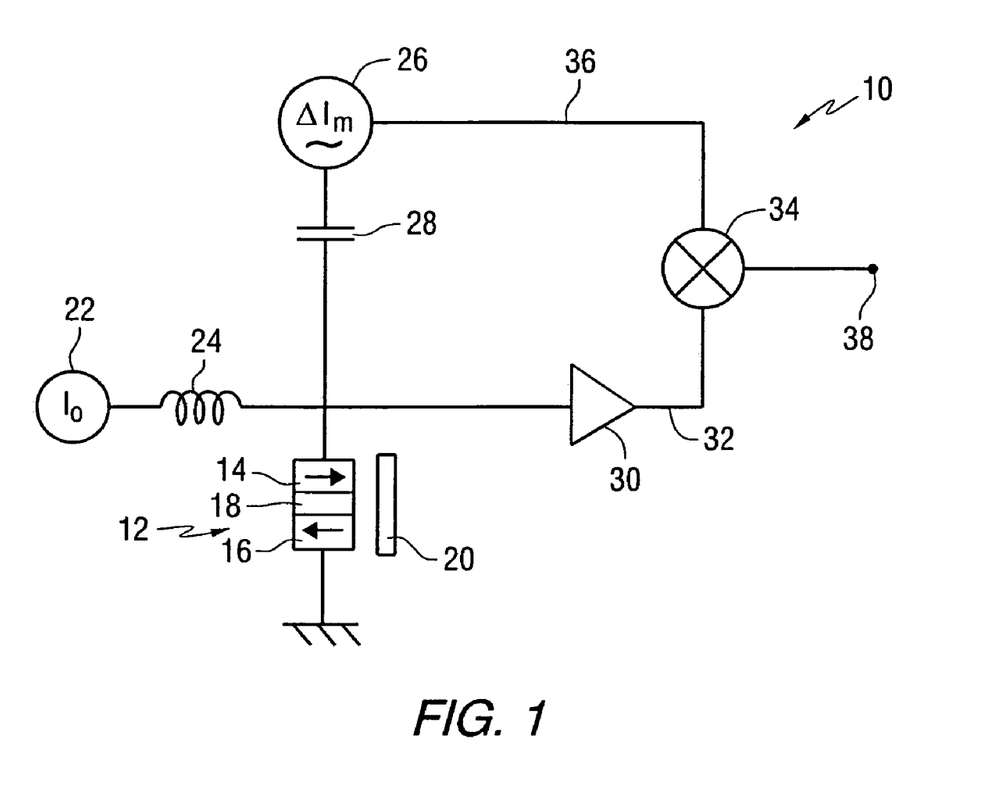
FIG. 1 is a schematic diagram of an apparatus constructed in accordance with one embodiment of the invention.

FIG. 1 is a schematic diagram of an apparatus 10 constructed in accordance with one embodiment of the invention. The apparatus includes a CPP sensor element 12 in the form of a multilayer structure that includes a reference layer 14 (also called a fixed layer), a free layer 16, and a spacer layer 18 positioned between the reference layer and the free layer. A magnetic field source 20, such as a permanent magnet, is positioned near the multilayer structure to subject the multilayer structure to a magnetic bias field. A DC current source 22 is electrically connected to the CPP sensor element through a lowpass filter 24 that is illustrated as an inductor. An AC current source 26 is electrically connected to the CPP sensor element through a highpass filter 28 that is illustrated as a capacitor. The voltage appearing across the CPP sensor element is amplified by an amplifier 30 to produce an amplified signal on line 32 that is coupled to a phase detector 34, which is illustrated as a mixer. A reference signal that is representative of the applied AC current is supplied to the phase detector on line 36. The phase detector determines the phase difference between the reference signal and the amplified signal and produces a DC output signal on line 38 that is representative of the phase difference between the reference signal and the amplified signal.

The apparatus of FIG. 1 can operate in accordance with a method of producing a read-back signal in a magnetic data storage device that includes the steps of applying an AC current and a DC current to a magnetically biased multilayer structure including a reference layer and a free layer separated by a spacer layer; and detecting a phase difference between the AC current and a voltage across the multilayer structure. The frequency of the applied AC current is close to the natural precession frequency of the multilayer structure.

The CPP sensor element can include a spin valve that is magnetically biased and the DC current causes an oscillation in the magnetization of a free layer in the CPP sensor element. Under quiescent conditions, the oscillation in the magnetization of a free layer is phase locked with the applied AC current with zero phase shift. However, when the CPP sensor element is subjected to an additional magnetic field, such as a magnetic field of a magnetic domain, or bit, in a magnetic storage medium, the oscillation in the magnetization of the free layer changes such that a phase difference between the voltage across the device and the AC current develops. Then the difference in phase between the oscillation in the magnetization of a free layer and the applied AC current can be used to indicate the presence of the additional magnetic field.

In one aspect, the present invention provides a read-back methodology actively utilizing the spin torque induced magnetization dynamics present in DC biased current-perpendicular-to-the-plane (CPP) spin valves. A CPP spin valve pillar with lateral dimensions below 200 nm can produce steady narrowband voltage oscillations for certain combinations of bias current and applied magnetic field. A magnetic field component perpendicular to the film plane of the CPP sensor is especially suited to producing narrowband oscillations.

Figure 2:
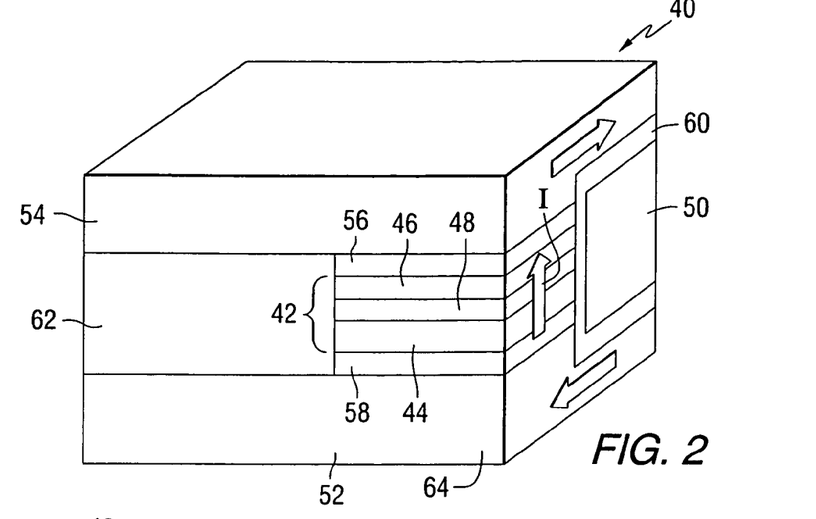
FIG. 2 is an isometric view of a sensor assembly that includes a CPP sensor element assembly.
Figure 3:
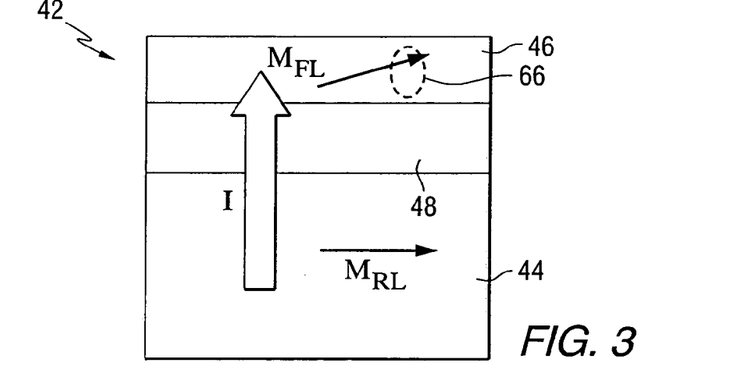
FIG. 3 is a side view of the CPP sensor element of FIG. 2.

FIG. 2 is an isometric view of a sensor assembly 40, also referred to as a resonance reader, that includes a CPP sensor element 42. FIG. 3 is a side view of the CPP sensor element 42. The CPP sensor element 42 includes a first layer 44 of magnetic material, a second layer of magnetic material 46, and a spacer layer 48 positioned between the first and second layers. The first layer has a fixed direction of magnetization $M_{RL}$. This first layer is also referred to as a reference layer, fixed layer, or pinned layer. In this example, the direction of magnetization $M_{RL}$ is substantially in the plane of the reference layer.

The second layer has a changeable direction of magnetization $M_{FL}$. The second layer is also referred to as a free layer. A magnetic field source 50, which in this example is a permanent magnet, is positioned near the CPP sensor element 42 to subject the CPP sensor element 42 to a bias magnetic field. The bias magnetic field can be substantially perpendicular or parallel to the planes of the free layer and the reference layer. The bias field enforces a state where the magnetizations of the free and reference layers are parallel to each other, be that parallel or perpendicular to the plane. For this example, the bias field enforces a parallel state. That is, it prevents the device from switching to an anti-parallel state—instead the device precesses.

The CPP sensor element 42 is positioned between, and electrically coupled to, first and second electrical conductors 52 and 54, which are also referred to as leads and/or shields. In this example, layers 56 and 58 of conductive material are positioned between the CPP sensor element 42 and the leads. Layers 56 and 58 are included to facilitate fabrication. Insulation 60 electrically separates the permanent magnet from the leads and the CPP sensor element 42. Additional insulation 62 separates the leads. An edge of the CPP sensor element is positioned adjacent to an air bearing surface 64 of a read head in which the sensor is mounted. In this example, the direction of magnetization $M_{FL}$ in the quiescent state is substantially in the plane of the free layer and substantially parallel to the reference layer fixed direction of magnetization $M_{RL}$.

A DC current, I, which is supplied by a DC current source, causes the free layer magnetization $M_{FL}$ to precess, or oscillate, as illustrated by ellipse 66. This precession changes the electrical resistance of the CPP sensor element. The combination of the applied current and the resistance of the CPP sensor element results in a voltage across the CPP sensor element. By placing the CPP sensor element near a magnetic storage medium, the magnetic fields produced by domains, or bits, in the storage medium further affect the magnetic oscillation and consequently the resistance, of the CPP sensor element. This changes the voltage produced across the CPP sensor element.

FIG. 2 is a schematic of a reader as viewed from the air bearing surface (ABS) 64. A CPP GMR nanopillar is connected to conducting leads that can also be ferromagnetic in order to serve as shields. This particular sensor is biased from behind by a permanent magnet (PM), although other biasing schemes are possible. FIG. 3 is a close-up view of the CPP GMR sensor. A CPP electrical current drives the free layer (FL) magnetization into precession.

FIGS. 2 and 3 illustrate a basic structure that can be used to practice the invention. The structure employs a conventional CPP GMR nanopillar that is compatible with existing recording head fabrication capability. However, the CPP read element is driven into ferromagnetic resonance via the spin torque that naturally occurs when passing an electrical current through the nanopillar. There are many materials choices that could be used for the various components described in FIGS. 2 and 3. For example, one implementation would be identical to a conventional CPP reader with the constraint that the dimensions of 42 perpendicular to the current direction be ~100 nm or less. In one example, conductors 52 and 54, and layers 56 and 58 can be gold, layer 44 can be Co(90)Fe(10), layer 48 can be Cu, layer 46 can be Ni(80)Fe(20), insulating material 62 and 60 can be alumina (i.e., $AlO_x$), and the magnetic field source 50 can be CoCrPt.

Figure 4:
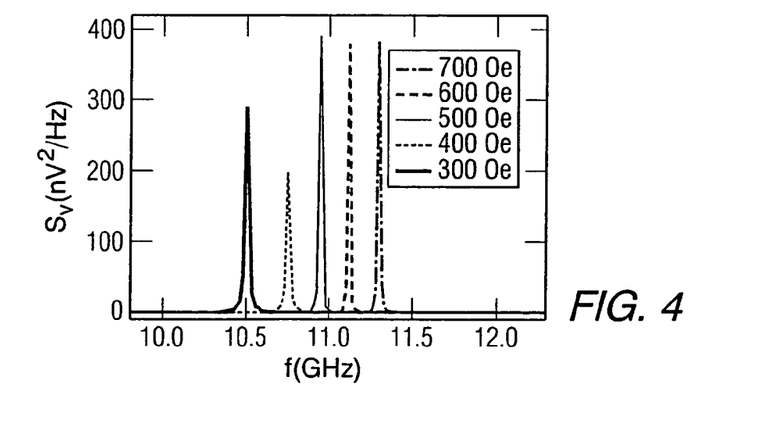
FIG. 4 is a graph of power spectral density versus frequency.

The resonant frequency of the free layer precession is dependent on the magnetic field acting on the CPP structure. FIG. 4 is a graph of measured power spectral density $S_v$ versus frequency of the voltage across an actual CPP sensor element for several levels of applied magnetic field. FIG. 4 shows experimental power spectral density data acquired from a comparable CPP spin valve that was driven into precession via spin torque. This free layer precession in combination with the GMR between the free layer and the fixed reference layer results in an oscillating voltage across the nanopillar, which can be used to detect the stray fields from the media. Phase locking of this oscillating signal to a stable source can allow read-back with a large signal-to-noise ratio (SNR) by the method described below.

Figure 5:
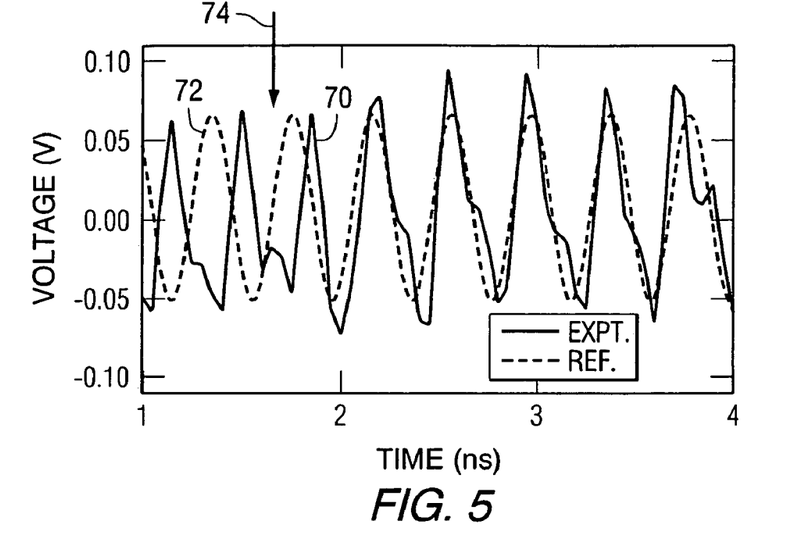
FIG. 5 is a graph of voltage versus time.
Figure 6:
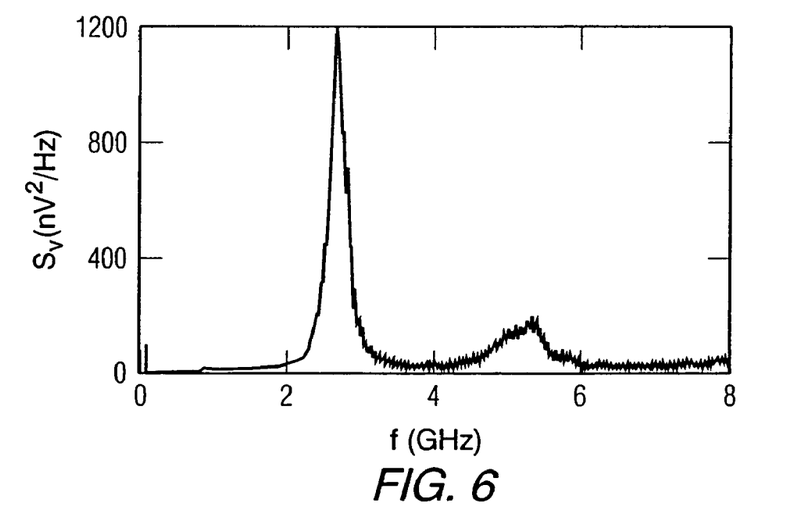
FIG. 6 is a graph of power spectral density versus frequency.

FIGS. 5 and 6 show experimental data from a CPP GMR device undergoing current driven precession. FIG. 5 shows a time trace 70 from an actual device and a reference sinusoidal waveform 72. FIG. 5 is a time trace of the output voltage from a CPP GMIR sensor undergoing spin transfer induced magnetic precession. Curve 70 represents actual experimental data, while curve 72 is a single-frequency sinusoidal waveform for reference. The arrow 74 highlights the phase noise inherent in magnetic precession.

Figure 7:
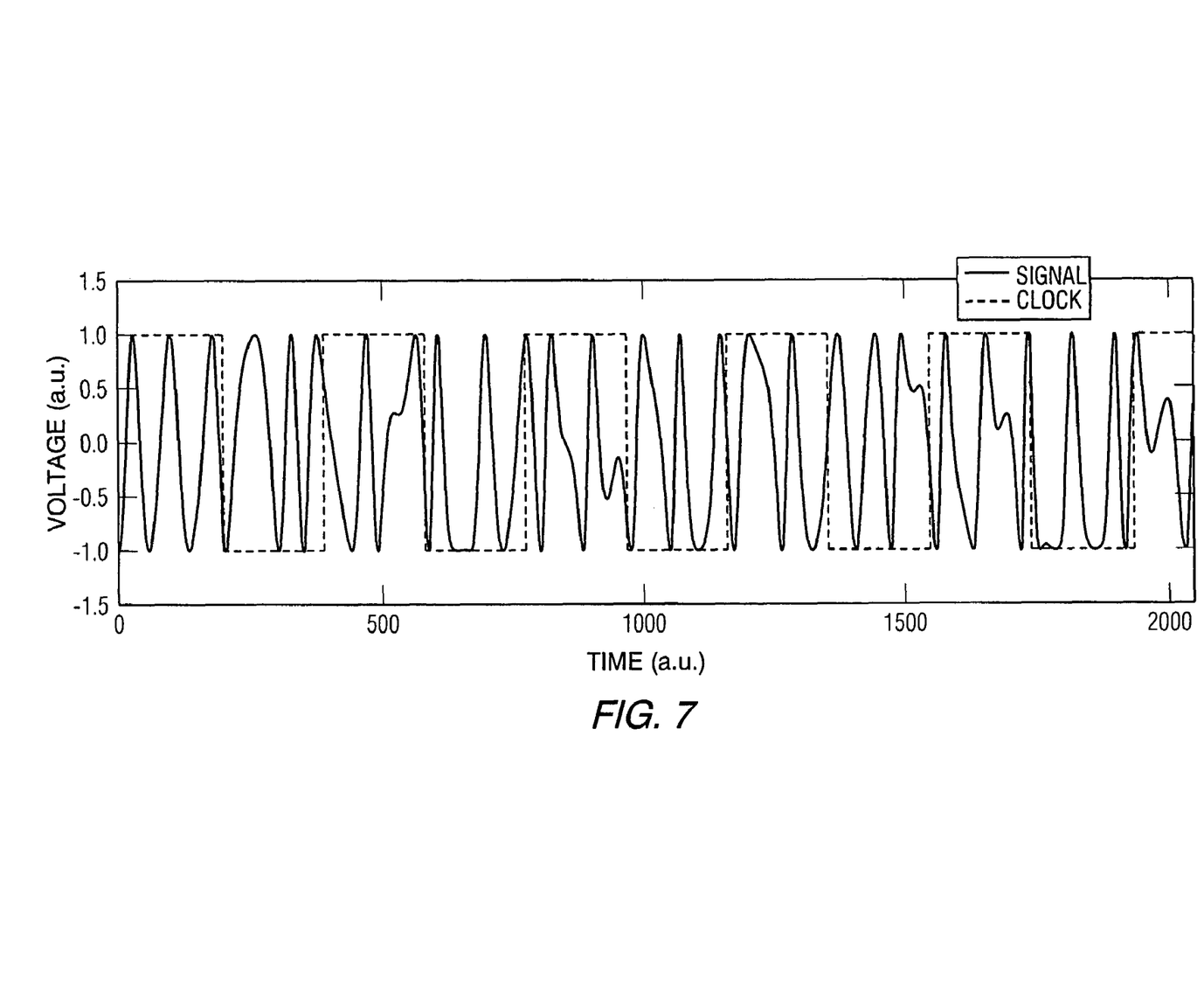
FIG. 7 is a graph of voltage versus time.

FIG. 6 shows the corresponding frequency domain noise spectrum. FIG. 7 is an illustrative example of a sinusoidal waveform with random phase noise overlaid with a hypothetical clock signal. FIG. 6 is a graph of the power spectral density $S_v$ versus frequency of the voltage across the CPP sensor element, resulting from a Fourier transform of data in FIG. 5. The oscillating signal from the device deviates from a perfect sinusoid because the phase randomly "slips" over time.

This phase noise is the reason why the peak in the frequency domain of FIG. 6 has a finite width. The practical implication of this phenomenon is illustrated by the example shown in FIG. 7. These data would be close to an actual recording situation where the precession frequency is only a few times larger than the recording frequency set by the clock.

As shown in FIG. 1, the CPP GMR reader in this concept is biased with both a DC and AC current that synchronizes the magnetic precession, with a ferromagnetic resonance (FMR) frequency $f_o$, to that of the AC current with a carrier frequency $f_c$. In the quiescent state of the device, the AC frequency is matched to the natural magnetic precession frequency, which will "lock" the magnetic precession with the same frequency and phase as the AC current. As the device is subjected to deviations in applied magnetic field at a modulation frequency $f_m$, as would occur from spinning disc media in a magnetic recording system, the magnetic precession will exhibit a phase difference between the oscillation voltage across the CPP sensor and the AC current through the device. This phase difference is detected by a phase detector, such as those within phase locked loops commonly used for communications systems, which either outputs a voltage that changes linearly with the phase difference between two input signals, or outputs a digital data stream based on some phase encoding scheme. The locked resonance frequency of the spin valve can exceed 20 GHz given sufficient magnetic and current bias leading to data rates well beyond the thermally activated magnetic resonance that typically is no more than a few GHz.

Phase modulation is most easily expressed as follows:

$$\phi = \phi_o + \phi_\Delta \cos(2\pi f_m t) \quad (1)$$

where $\phi$ is the instantaneous phase of the signal, $\phi_o$ is the original phase of the signal, $\phi_\Delta$ is the maximum achievable phase deviation, and $f_m$ is the modulation frequency or about ½ the data rate. The modulation frequency can be produced by a varying magnetic field, such as from bits on a storage medium, as it moves with respect to a reader.

The frequency of the signal is the derivative of the instantaneous phase, just like the angular velocity is the derivative of the angle:

$$f = \frac{1}{2\pi}\frac{d\varphi}{dt} = \varphi_\Delta f_m \sin(2\pi f_m t). \quad (2)$$

The phase modulation is mathematically equivalent to frequency modulation when $f_\Delta = \phi_\Delta f_m$, however the physical parameters that determine the SNR of the signal are different. In the present invention, the bias current and bias field are tuned to produce oscillations at a frequency $f_c$, which will be matched by the external excitation frequency, such that the external oscillator and the reader are locked together. In other words, the device will injection lock (entrain) to the frequency of the carrier current. The phase difference between the external oscillator and the device voltage oscillations depends on the external magnetic field as is predicted by classical injection locking theory. See for example, W. H. Rippard, M. R. Pufall, S. Kaka, T. J. Silva, S. E. Russek, and J. Katine, Phys Rev. Lett. 95, 067203 (2005).

The phase difference will vary monotonically and continuously. Typical parameters for a magnetic recording system would be $\phi_\Delta = \pi$, and $f_m = 1$ GHz.

The practical implementation of FIG. 1 for phase detection reading within a magnetic recording system requires the spin valve reader to be injection locked to an AC current with zero phase difference in the quiescent state. Out of plane fields from the bits on an adjacent magnetic storage medium will produce a phase difference between the modulation signal and the CPP sensor voltage. This difference is converted into a DC voltage by a phase detector, such as a double balanced diode mixer, outside the read head. This detection scheme is appropriate for high data rates due to the high frequencies that have been proven to be >20 GHz, excited by the spin torque effect in CPP spin valve structures. For example, at $f_c = 20$ GHz operating frequency, and given 10 cycles for averaging the phase detector output, $f_m = 2$ GHz (giving a data rate of 4 Gbits/sec) is achievable. Higher data rates utilizing higher operating frequencies are, in principle, possible.

For a phase locked resonance reader, the signal-to-noise ratio (SNR) of the read-back system is:

$$SNR = 10 \cdot \log\left(\frac{2E_{peak}}{N_o BW}\right), \quad (3)$$

where $E_{peak}$ is the power in the resonance peak and $N_o$ is the noise in the given bandwidth BW. Assuming that thermal noise is dominant, $N_o = 4 k_B T = 16$ pW/GHz at 300° K, where $k_B = 1.38 \times 10^{-23}$ J/K is the Boltzmann constant. The bandwidth for phase modulation is:

$$BW = 2(h+1)f_m, \quad (4)$$

where $f_m$ is the modulation frequency and h is the modulation index.

For phase detection, h parameterizes the variations in the phase of the carrier signal, $h = \phi_\Delta \leq \pi$. It has been demonstrated that certain CPP devices can get as much as $E_{peak} \approx 2500$ pW. With that much energy, $f_c = 20$ GHz, $f_m = 1$ GHz, and $h \approx 1$, the SNR is 19 dB. This example is attractive for use in a recording system and, in principle, this concept can be further optimized for a greater signal-to-noise ratio (SNR). Hence, the two key features of this reader concept, coherent locking of the precession to a fixed frequency and phase detection, result in a reader SNR that can satisfy the requirements of a high areal density and high data rate magnetic recording system.

There are many different types of GMR thin film multilayers that, in principle, can satisfy the operating characteristics called for in this invention. FIGS. 8-14 are schematic drawings of several CPP sensor element assemblies.

The CPP nanopillar can contain in-plane magnetized ferromagnetic layers or layers that are perpendicularly magnetized. In addition, external biasing techniques that are commonly used for GMR readers, such as permanent magnets, can be used to reliably configure the magnetic environment of the nanopillar. Furthermore, the upper and lower leads can contain ferromagnetic shields or simply just non-magnetic metal for shieldless designs.

Figure 8:
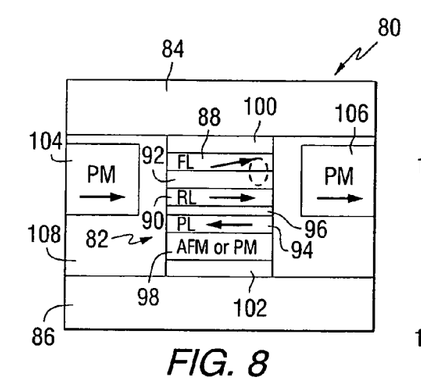
FIGS. 8-14 are schematic drawings of several CPP sensor element assemblies.

FIG. 8 is a schematic drawing of a CPP sensor element assembly 80 that can be used in an embodiment of the invention. The assembly includes a multilayer structure 82 connected between leads 84 and 86. The multilayer structure 82 includes a free layer 88 and a reference layer 90, separated by a first spacer layer 92. A pinned layer 94 is separated from the reference layer by a second spacer layer 96. An antiferromagnetic layer 98 is positioned adjacent to the pinned layer. Layers 100 and 102 of electrically conducting material are positioned at opposite ends of the multilayer stack. Permanent magnets 104 and 106 are mounted on opposite sides of the multilayer stack, and surrounded by insulation 108. Arrows are included to show the direction of magnetization of the various layers.

Figure 9:
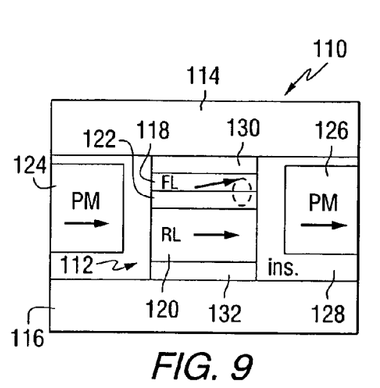

FIG. 9 is a schematic drawing of a CPP sensor element assembly 110 that includes a multilayer structure 112 connected between leads 114 and 116. The multilayer structure 112 includes a free layer 118 and a reference layer 120, separated by a first spacer layer 122. Permanent magnets 124 and 126 are mounted on opposite sides of the multilayer stack, and surrounded by insulation 128. Arrows are included to show the direction of magnetization of the various layers. Layers 130 and 132 of electrically conducting material are positioned at opposite ends of the multilayer stack.

Figure 10:
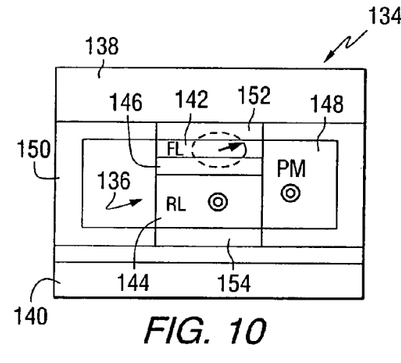

FIG. 10 is a schematic drawing of a CPP sensor element assembly 134 that includes a multilayer structure 136 connected between leads 138 and 140. The multilayer structure 136 includes a free layer 142 and a reference layer 144, separated by a first spacer layer 146. A permanent magnet 148 is mounted behind the multilayer stack, and surrounded by insulation 150. Arrows are included to show the direction of magnetization of the various layers. Layers 152 and 154 of electrically conducting material are positioned at opposite ends of the multilayer stack.

Figure 11:
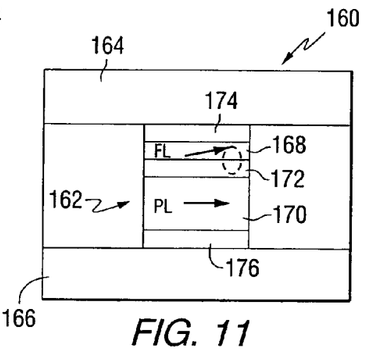

FIG. 11 is a schematic drawing of a CPP sensor element assembly 160 that includes a multilayer structure 162 connected between leads 164 and 166. The multilayer structure 162 includes a free layer 168 and a pinned layer 170, separated by a first spacer layer 172. The pinned layer can be a permanent magnet. The free layer can be biased similar to the previous examples or by shape anisotropy. Arrows are included to show the direction of magnetization of the various layers. Layers 174 and 176 of electrically conducting material are positioned at opposite ends of the multilayer stack.

Figure 12:
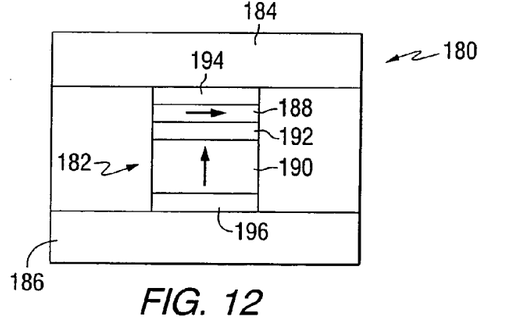

FIG. 12 is a schematic drawing of a CPP sensor element assembly 180 that includes a multilayer structure 182 connected between leads 184 and 186. The multilayer structure 182 includes a free layer 188 and a reference layer 190, separated by a first spacer layer 192. In this example, the direction of magnetization of the reference layer is perpendicular to the plane of the reference layer. Arrows are included to show the direction of magnetization of the various layers. Layers 194 and 196 of electrically conducting material are positioned at opposite ends of the multilayer stack.

FIGS. 8-12 show ABS views of different possible CPP structures and biasing schemes. FIG. 8 shows a conventional CPP spin valve biased with two permanent magnets positioned on either side. FIG. 9 shows a simpler CPP structure with one thick and one thin magnetic layer that are biased with permanent magnets on either side. FIG. 10 shows a CPP structure with two magnetic layers that is biased with a permanent magnet from behind. FIG. 11 shows a CPP structure incorporating one permanent magnet and one free layer. The structure of FIG. 12 is similar to that of FIG. 11, but with the permanent magnet magnetized perpendicular to the plane of the film. Either the bottom or top magnetic layer can undergo current driven precession, depending on the layer thicknesses and materials chosen for the sensor design.

The design variations shown in FIGS. 8-12 closely resemble typical GMR reader structures. However, the high amplitude, narrowband oscillations that are desirable for this invention may require magnetic layers that have a significant magnetization component perpendicular to the plane of the thin film multilayer. FIG. 12 shows an example where a magnetic layer having intrinsic perpendicular magnetic anisotropy is incorporated into the CPP nanopillar. Another alternative is to apply a perpendicular magnetic bias field to in-plane magnetized layers.

Figure 13:
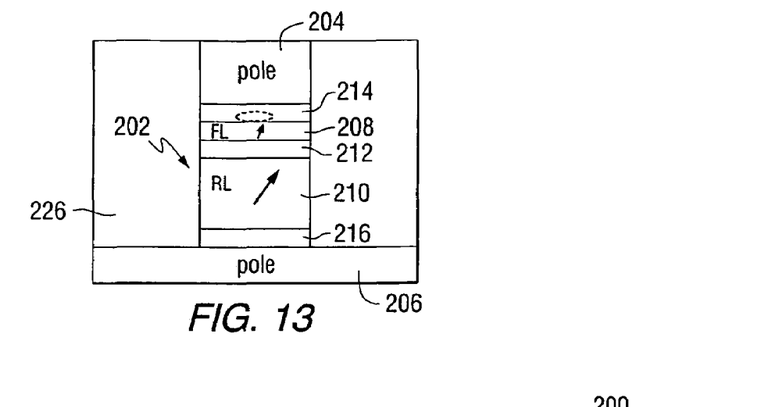
Figure 14:
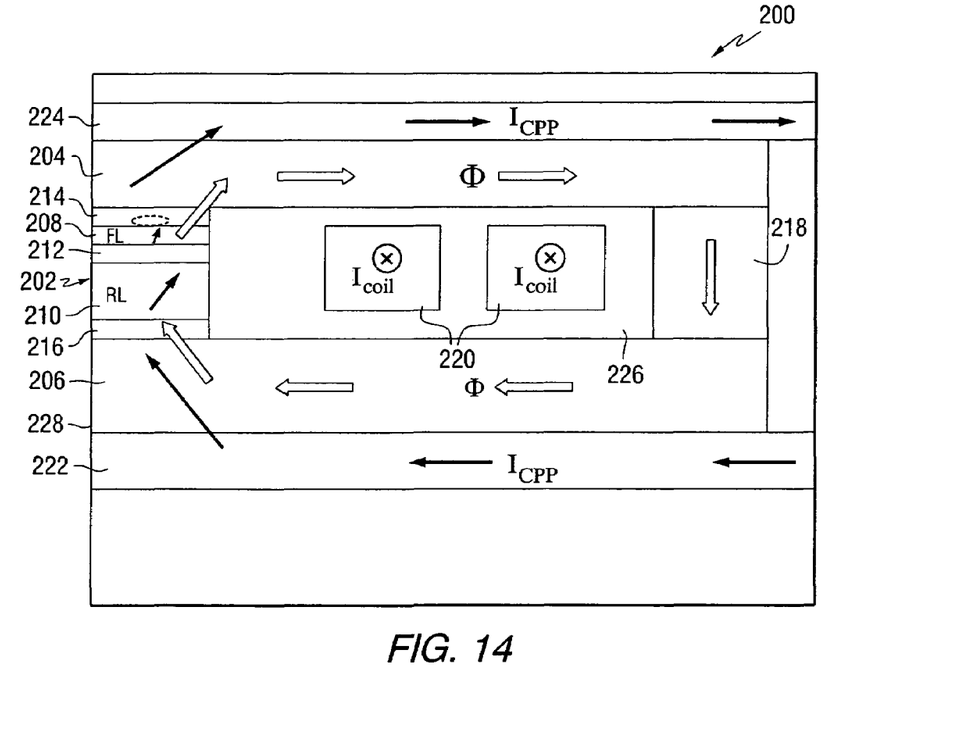

Instead, the perpendicular biasing alternative shown in FIGS. 13 and 14 may be more practical and efficient. FIG. 13 is an air bearing view, and FIG. 14 is a cross-sectional view, of a CPP sensor element assembly 200 that can be used in another embodiment of the invention. In the assembly of FIGS. 13 and 14, a multilayer structure 202 is mounted between first and second poles 204 and 206. The multilayer structure 202 includes a free layer 208 and a reference layer 210, separated by a first spacer layer 212. Arrows are included to show the direction of magnetization of the various layers. Layers 214 and 216 of electrically conducting material are positioned at opposite ends of the multilayer stack. The poles are magnetically coupled by a yoke or pedestal 218. Current flowing in a coil 220, that includes conductors positioned between the poles, is used to induce magnetic flux $\Phi$ in the poles. This results in a magnetic field that biases the multilayer structure. Leads 222 and 224 are electrically connected to the multilayer structure through the poles and provide electrical current to the multilayer structure. Insulation 226 is positioned around the coil conductors and the multilayer structure. The multilayer structure is positioned adjacent to the air bearing surface (ABS) 228.

FIGS. 13 and 14 show a design that uses an electromagnet for biasing the magnetizations of layers in a CPP GMR element perpendicular to the plane of the film. A CPP GMR element is placed in the gap of a ferromagnetic yoke. The reference layer (RL) can either be directly exchange coupled to the bottom pole or be decoupled via the insertion of a non-magnetic layer 216. In this example, the magnetization of the reference layer is shown at an acute angle with respect to the plane of the reference layer. The reference layer may have a larger tendency to stay in the plane of the reference layer in the absence of an external bias field due to a chosen magnetic material with higher magnetization than the free layer. Thus the bias field cannot saturate the reference layer out of plane completely as with the free layer.

The CPP nanopillar is incorporated into the gap of a ferromagnetic yoke that is essentially the same as a typical writer. The magnetic field from the current-carrying coil magnetizes the yoke, yielding a large magnetic field between the two poles of the yoke located at the air bearing surface. Typical yoke materials are metallic, so the yoke can also be incorporated into the pair of electrical leads that are connected to the CPP nanopillar.

Figure 15:
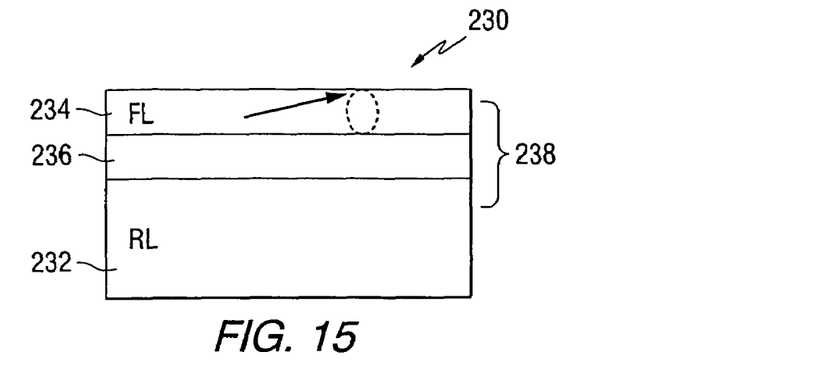
FIGS. 15-17 are schematic drawings of several CPP sensor elements.
Figure 16:
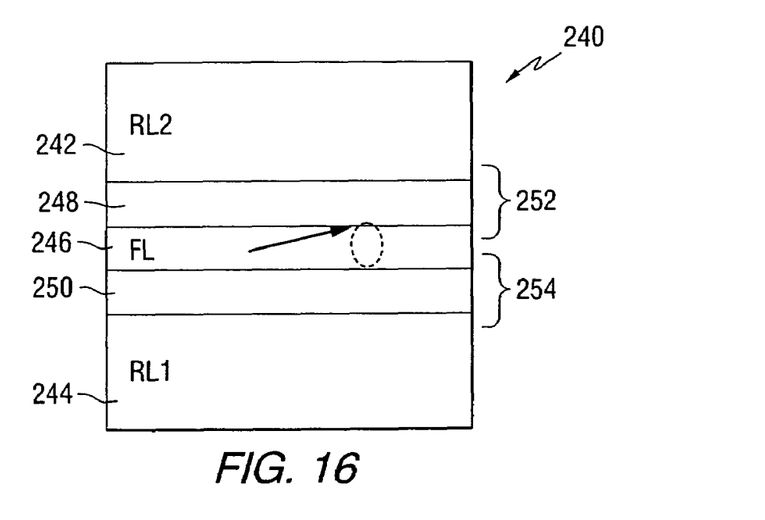
Figure 17:
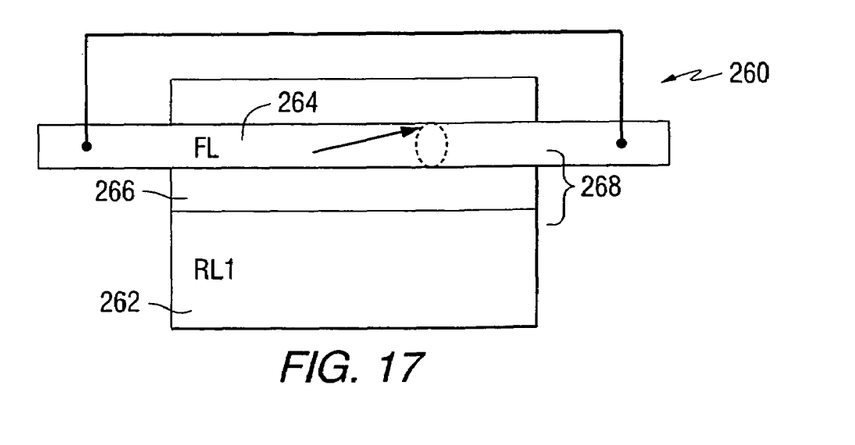

FIGS. 15-17 show different embodiments of multilayer structures that can be used as a resonance reader. FIG. 15 is a multilayer structure 230 including a reference layer 232 and a free layer 234 separated by a spacer layer 236. The spin torque and magnetoresistance are mediated between a pair of ferromagnetic layers. The combination 238 of layers 232, 234 and 236 provides both spin torque to drive precession and GMR for magnetic field detection.

FIG. 16 is a multilayer structure 240 including two reference layers 242 and 244 on opposite sides of a free layer 246 separated from the free layer by spacer layers 248 and 250. In the structure of FIG. 16, electron transport through the bottom two layers produces spin torque precession of the middle free layer, and the magnetoresistive detection of the free layer precession is dominated by the relative orientation of the top two ferromagnetic layers. The combination 252 of layers 242, 246 and 248 provides a TMR sensor for magnetic field detection. The combination 254 of layers 244, 246 and 250 provides spin torque to drive precession.

In FIG. 16, layer 248 is a tunnel barrier (insulator), and layer 250 is a metallic spacer. The bottom two layers form RL1 and FL, and the top two layers form FL and RL2.

FIG. 17 is a multilayer structure 260 including a reference layer 262 and a free layer 264 separated by a spacer layer 266. In the structure of FIG. 17, spin torque is mediated between the bottom two ferromagnets and the extraordinary Hall effect is used for detection. The combination 268 of layers 262, 264 and 266 provides spin torque to drive precession. The free layer uses the extraordinary Hall effect for detection.

The invention can be implemented using more complicated structures if the output voltage needs to be independently optimized from the active part of the device responsible for producing the spin resonance. FIGS. 15-17 illustrate ways to conceptually decouple the CPP nanopillar into two distinct regions so that one part of the nanopillar mediates the spin torque driven oscillations, while the other optimizes the amplitude. The simple two-layer spin valve in FIG. 15 can be modified so that it relies on either tunneling magnetoresistance (FIG. 16) or the extraordinary Hall effect (FIG. 17) for the read-back voltage.

Figure 18:
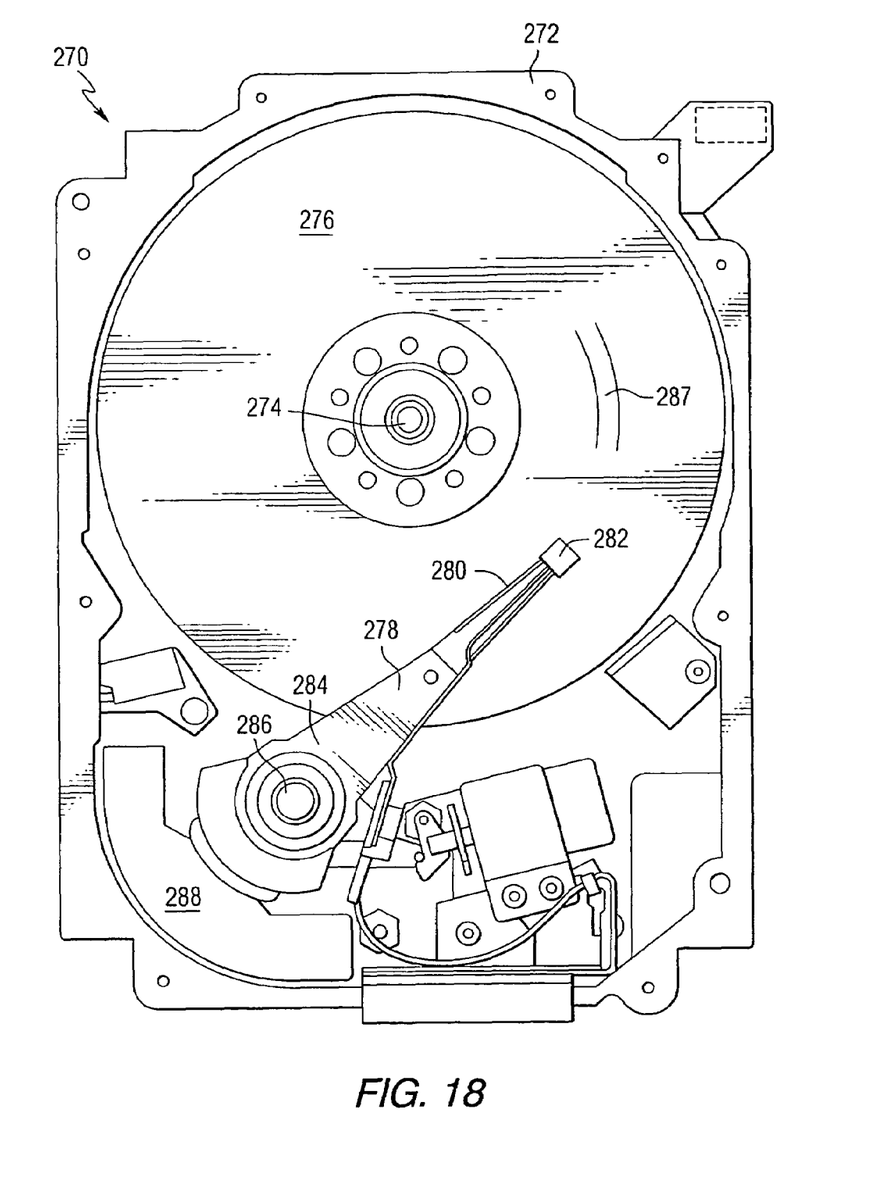
FIG. 18 is a pictorial representation of a magnetic storage device that can include the invention.

FIG. 18 is a pictorial representation of a magnetic storage device in the form of a disc drive 270 that can utilize a reader in accordance with this invention. The disc drive 270 includes a housing 272, with the upper portion removed and the lower portion visible in this view, sized and configured to contain the various components of the disc drive. The disc drive 270 includes a spindle motor 274 for rotating at least one storage medium 276, which may be a magnetic storage medium within the housing 272. At least one arm 278 is contained within the housing 272, with each arm 278 having a first end 280 with a recording head or slider 282, and a second end 284 pivotally mounted on a shaft by a bearing 286. An actuator motor 288 is located at the arm's second end 284 for pivoting the arm 278 to position the recording head 282 over a desired sector or track 287 of the disc 276. The actuator motor 288 is regulated by a controller, which is not shown in this view and is well-known in the art. The reader can be included in the recording head and positioned by the arm such that the reader is adjacent the magnetic storage medium.

In one aspect, the invention provides a read-back sensor for high areal density and high data rate magnetic recording. The read element is a CPP nanopillar driven into magnetic precession via spin torque. The electrical current that biases that CPP device is a sum of a DC current and an AC current that is used to lock the magnetic precession frequency to that of the AC current. Stray magnetic fields from an adjacent magnetic storage medium induce phase shifts between the magnetic precession and the AC current modulation, which are detected using a phase detection scheme, such as a phase detection scheme that is commonly used in digital communications.

In another aspect, the invention provides a magnetic field sensor that can be used to sense magnetic fields from other field sources. The invention can provide high speed sensing of magnetic fields.

While the invention has been described in terms of several embodiments, it will be apparent to those skilled in the art that various changes can be made to the described embodiments without departing from the scope of the invention as set forth in the following claims.

What is claimed is:

1. An apparatus comprising:
    a magnetically biased multilayer structure including a reference layer and a free layer separated by a spacer layer;
    a DC current source connected to the multilayer structure;
    an AC current source connected to the multilayer structure; and
    a phase detector for measuring a phase difference between an AC current and a voltage across the multilayer structure.

2. The apparatus of claim 1, wherein current from the DC current source causes precession of a direction of magnetization of the free layer or the reference layer.

3. The apparatus of claim 2, wherein the precession of the direction of magnetization is phase locked to current from the AC current source.

4. The apparatus of claim 1, further comprising:
    a magnetic field source providing a bias magnetic field for the multilayer structure.

5. The apparatus of claim 4, wherein the magnetic field source comprises:
    a permanent magnet or an electromagnet.

6. The apparatus of claim 1, further comprising:
    a magnetic storage medium, wherein the phase difference is induced by magnetic fields from the magnetic storage medium.

7. The apparatus of claim 1, wherein a bias magnetic field applied to the multilayer structure is substantially in the plane of the free layer.

8. The apparatus of claim 1, wherein a bias magnetic field applied to the multilayer structure is substantially perpendicular to the plane of the free layer.

9. The apparatus of claim 1, wherein a quiescent direction of magnetization of the reference layer is substantially in the plane of the reference layer.

10. The apparatus of claim 1, wherein a quiescent direction of magnetization of the reference layer is substantially perpendicular to the plane of the reference layer.

11. The apparatus of claim 1, wherein a quiescent direction of magnetization of the free layer is substantially in the plane of the free layer.

12. The apparatus of claim 1, wherein a quiescent direction of magnetization of the free layer is substantially perpendicular to the plane of the free layer.

13. The apparatus of claim 1, wherein the multilayer structure further includes a second reference layer and a second spacer layer.

14. The apparatus of claim 1, wherein the reference layer comprises:
    a pinned layer; and
    an antiferromagnetic layer.

15. The apparatus of claim 1, wherein the reference layer comprises:
    a Hall effect layer.

16. A method comprising:
    applying an AC current and a DC current to a magnetically biased multilayer structure including a reference layer and a free layer separated by a spacer layer; and
    detecting a phase difference between the AC current and a voltage across the multilayer structure.

17. The method of claim 16, wherein the DC current causes precession of a direction of magnetization of the free layer or the reference layer.

18. The method of claim 17, wherein the precession of the direction of magnetization is phase locked to the AC current.

19. The method of claim 16, wherein the multilayer structure is subjected to a bias magnetic field either substantially in the plane of the free layer or substantially perpendicular to the plane of the free layer.

20. The method of claim 16, wherein the phase difference is induced by magnetic fields from a magnetic storage medium.

* * * * *